(12) United States Patent
Klein et al.

(10) Patent No.: US 8,257,617 B2  
(45) Date of Patent: Sep. 4, 2012

(54) FUNCTIONAL PASTE

(75) Inventors: Sylke Klein, Rossdorf (DE); Armin Kuebelbeck, Bensheim (DE); Werner Stockum, Reinheim (DE); Jun Nakanowatari, Sagamihara (JP); Kiyohiko Kawamoto, Atsugi (JP); Katsumi Tanino, Toyama (JP)

(73) Assignee: Merck Patent GmbH, Darmstadt (DE)

( * ) Notice: Subject to any disclaimer, the term of this patent is extended or adjusted under 35 U.S.C. 154(b) by 1069 days.

(21) Appl. No.: 10/579,857

(22) PCT Filed: Oct. 22, 2004

(86) PCT No.: PCT/EP2004/011941  
§ 371 (c)(1),  
(2), (4) Date: May 17, 2006

(87) PCT Pub. No.: WO2005/050673  
PCT Pub. Date: Jun. 2, 2005

(65) Prior Publication Data  
US 2007/0148810 A1 Jun. 28, 2007

(30) Foreign Application Priority Data  
Nov. 18, 2003 (JP) .................. 2003-388424

(51) Int. Cl.  
*H01B 1/22* (2006.01)  
*H01L 21/00* (2006.01)

(52) U.S. Cl. .......... 252/513; 252/512; 252/514; 438/72; 438/98

(58) Field of Classification Search .......... 75/252; 252/513, 514; 148/24–26  
See application file for complete search history.

(56) References Cited

U.S. PATENT DOCUMENTS

| | | | | |
|---|---|---|---|---|
| 3,915,729 A | * | 10/1975 | Eustice | 106/268 |
| 4,273,593 A | * | 6/1981 | Mastrangelo | 148/24 |
| 4,293,451 A | * | 10/1981 | Ross | 252/512 |
| 4,388,346 A | * | 6/1983 | Beggs et al. | 438/98 |
| 4,475,682 A | * | 10/1984 | Coyle et al. | 228/123.1 |
| 4,564,563 A | * | 1/1986 | Martin et al. | 428/546 |
| 4,703,553 A | * | 11/1987 | Mardesich | 438/89 |
| 4,732,702 A | * | 3/1988 | Yamazaki et al. | 252/512 |
| 5,045,236 A | * | 9/1991 | Tsunaga et al. | 252/512 |
| 5,698,451 A | * | 12/1997 | Hanoka | 438/98 |
| 6,372,077 B1 | * | 4/2002 | Tecle | 156/279 |
| 6,379,745 B1 | | 4/2002 | Kydd et al. | |
| 6,695,903 B1 | | 2/2004 | Kubelbeck et al. | |

FOREIGN PATENT DOCUMENTS

| | | |
|---|---|---|
| DE | 153 360 A | 1/1982 |
| JP | 4 268381 | 4/1992 |
| JP | 07-090204 A | 4/1995 |
| WO | WO 00/54341 A | 9/2000 |
| WO | WO 03/003381 A | 1/2003 |

OTHER PUBLICATIONS

Office Action in related Korean Patent Application No. 2006-7006318 dated Mar. 13, 2012.  
Asahi Chem Ind Co. Ltd.; Copper Alloy Composition; Patent Abstracts of Japan; Sep. 24, 1992; English Abstract of JP-04-268381.  
Asahi Chem Ind Co. Ltd.; Conductive Material Paste For Outer Electrode Of Solar Cell; Apr. 4, 1995; Machine Translation of JP-07-090204 A.

* cited by examiner

*Primary Examiner* — Roy King  
*Assistant Examiner* — Ngoclan T Mai  
(74) *Attorney, Agent, or Firm* — Millen, White, Zelano & Branigan, P.C.

(57) ABSTRACT

To provide functional paste with etching activity and good electrical properties. Functional paste comprising a metal powder, an etching agent, a binder and an organic solvent.

15 Claims, 1 Drawing Sheet

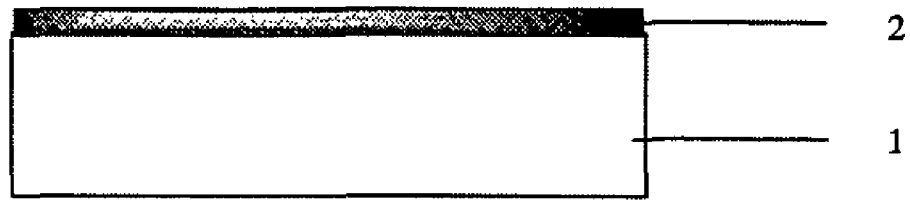
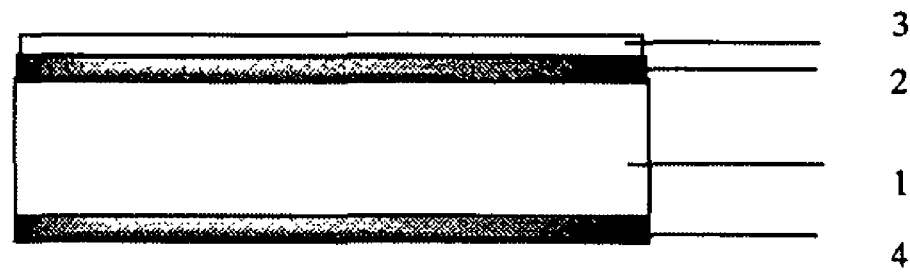
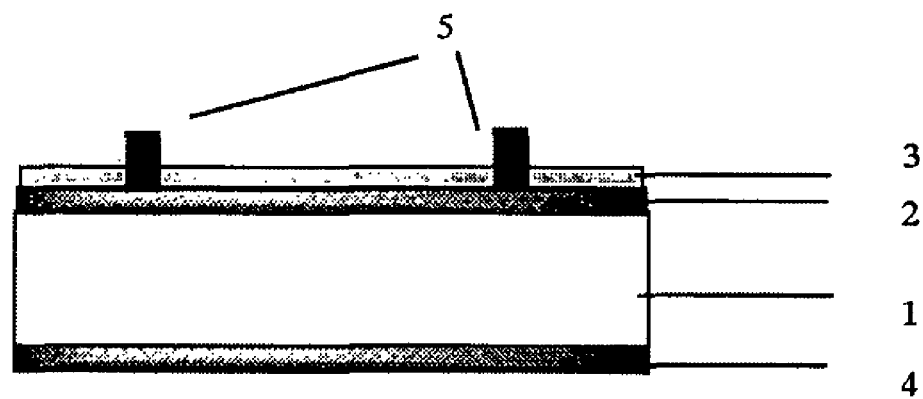
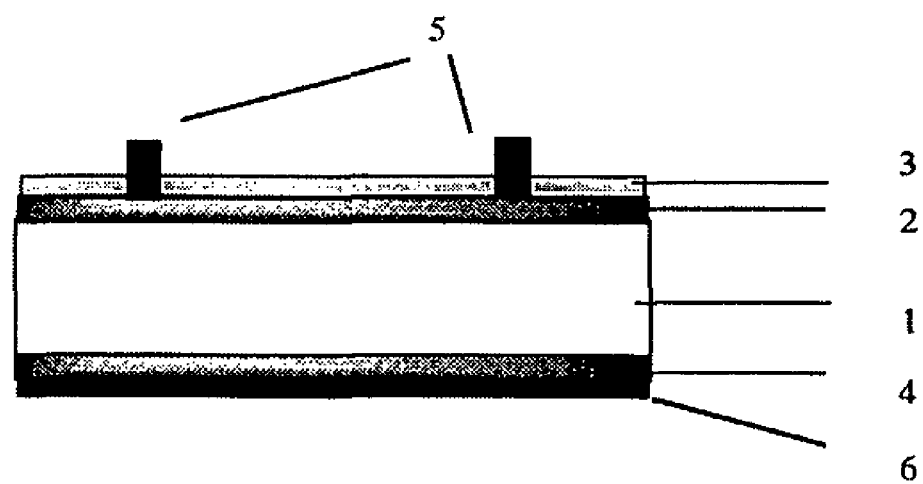

FUNCTIONAL PASTE

FIELD OF THE INVENTION

The invention relates to functional paste having an etching function and conductivity.

BACKGROUND OF THE INVENTION

At present extensive research has been performed on conductive paste containing a metal powder, because it is used for various purposes including fabrication of electrodes for solar cells, formation of jamper cables using electronic components, e.g., printed-wiring boards, and formation of terminal outgoing lines of printed resistors.

For example, in the fabrication of surface electrodes of solar cells, conventionally, an antireflection layer formed on a semiconductor layer is patterned using photoresist, then a surface electrode is fabricated (patent reference 1). However, this method is very complicated because it requires two steps: patterning of an antireflection layer, and fabrication of an electrode.

To eliminate the patterning process of antireflection layers, a method was proposed, wherein an antireflection layer is formed only on an light absorption side by masking the semiconductor layer during the formation of the antireflection layer which is the process prior to the patterning process. However, this method of direct patterning of antireflection layers has technological difficulties, and is not yet sufficient for practical application. Meanwhile, as a study on the fabrication of surface electrodes of solar cells, a so-called fire-through method has been proposed (patent reference 2), in which after the easy formation of an antireflection layer using a method such as a thermal oxidation method, conductive paste comprising a metal powder and a glass material is printed on the antireflection layer, then the metal powder is in contact with the n- or p-layer silicon of the silicon substrate to form an electrode while the glass material contained in the conductive paste melts the antireflection layer, so that the conduction between the metal electrode and the n- or p-layer silicon can be ensured. However, because this fire-through method requires a baking process generally at a high temperature of 850° C., the glass component and the electrode sometimes penetrate the n-layer, resulting in the deterioration of electrical properties of solar cells; therefore, accurate control of the fabrication conditions is necessary. In addition, when there is no uniform conduction between the electrode and the n-layer silicon, initial electrical properties of solar cells deteriorate, leading to a problem.

Thus, the development of functional paste having a superior etching function and good electrical properties has been strongly desired in the art.

Patent reference 1: Patent Application No. 2000-49368
Patent reference 2: Patent Application No. 2002-176186

DISCLOSURE OF THE INVENTION

Aims of the Invention

The invention was performed under the above circumstances, and it provides functional paste which has etching activity and good electrical properties.

SUMMARY OF THE INVENTION

Inventors of the invention made extensive examinations to resolve the above issues, and found that during the fabrication process of paste by mixing a metal powder, a binder and an organic solvent, the mixture of an etching agent into the paste enables stable etching of an antireflection layer at a low temperature of approximately 200° C. in the fabrication of a surface electrode of a solar cell. The invention was achieved based on this finding.

Thus, the invention relates to functional paste comprising a metal powder, an etching agent, a binder and an organic solvent.

The invention also relates to the functional paste which further comprises a diluent.

The invention also relates to the functional paste wherein the diluent is butylcarbitol.

The invention also relates to the functional paste wherein the etching agent has removal activity of oxidation layers on the surface of the metal powders.

The invention also relates to the functional paste wherein the etching agent has etching activity for antireflection layers of solar cells.

The invention also relates to the functional paste wherein the etching agent has removal activity of oxidation layers and/or nitride layers of Si.

The invention also relates to the functional paste wherein the etching agent is $NH_4HF_2$ or $NH_4F$.

Furthermore, the invention relates to the functional paste wherein the metal powder is one or more powder selected from the group consisting of Ag-coated Ni powder, Cu powder, Ag powder, Au powder, Pd powder and Pt powder.

The invention also relates to the functional paste wherein the binder contains a thermosetting resin.

The invention also relates to the functional paste wherein the thermosetting resin is an epoxy resin and/or phenol resin.

The invention also relates to the functional paste wherein the organic solvent is polyhydric alcohol or its mixture.

The invention also relates to the functional paste wherein the polyhydric alcohol is glycerin and/or ethylene glycol.

Furthermore, the invention relates to a solar cell comprising a semiconductor layer, an antireflection layer above the semiconductor layer, and a surface electrode which penetrates through the antireflection layer to bring the semiconductor layer into conduction, wherein the solar cell is fabricated by coating and baking the functional paste comprising a metal powder, an etching agent having etching activity for antireflection layers, a binder and an organic solvent, on the antireflection layer in a desired electrode shape.

The invention also relates to an electric circuit formed by coating and baking the functional paste comprising a metal powder, an etching agent having removal activity of oxidation layers on the surface of the metal powders, a binder and an organic solvent, on a substrate in a desired pattern.

Furthermore, the invention relates to a method of fabricating a solar cell comprising a semiconductor layer, an antireflection layer above the semiconductor layer, and a surface electrode which penetrates through the antireflection layer to bring the semiconductor layer into conduction, wherein the method comprises coating and baking the functional paste comprising a metal powder, an etching agent having etching activity for antireflection layers, a binder and an organic solvent, on the antireflection layer in a desired electrode shape.

The invention also relates to a method of forming electric circuits, which comprises coating and baking the functional paste comprising a metal powder, an etching agent having removal activity of oxidation layers on the surface of the metal powders, a binder and an organic solvent, on a substrate in a desired pattern.

UTILITY OF THE INVENTION

According to the invention, an etching agent contained in the paste enables stable removal of an antireflection layer under a low temperature without penetrating the n-layer for the fabrication of electrodes of solar cells, thus achieving easy, single-step fabrication of surface electrodes with a low interface resistance.

The invention also enables stable and single-step fabrication of surface electrodes at a low temperature of approximately 200° C., thus significantly simplifying the fabrication process. Therefore, by the simple replacement of conventional materials with the functional paste of the invention, the cost and yield can be markedly improved, which provides significant contribution to the art.

Furthermore, because a thin natural oxidation layer is formed on the surface of metal powders of paste due to water or oxygen, sometimes stable electric conduction may not be obtained. However, with the functional paste according to this invention, the etching agent also removes such oxidation layers, and thus, the formation of an electric circuit with extremely small resistance is achieved.

PREFERRED EMBODIMENT OF THE INVENTION

The following is a detailed explanation of the invention.

As a metal powder of the functional paste of the invention, a Ag-coated Ni powder, Cu powder, Ag powder, Ni powder and Al power are used. Among them, a Ag-coated Ni powder, Cu powder and Ag powder are preferred from the viewpoint of soldering characteristics. The contents of the metal powder relative to the total weight of the functional paste are, preferably 60-99 wt. %, and more preferably 65-90 wt. %.

As an etching agent of the functional paste of the invention, bifluoride such as $NH_4HF_2$ and $NH_4F$ is used; among them, $NH_4HF_2$ is preferred from the viewpoint of reactivity. The contents of the etching agent relative to the total weight of the functional paste are, preferably 0.1-20 wt. %, and more preferably 1-10 wt. %.

As a thermosetting resin contained in the binder of the functional paste of the invention, an epoxy resin, phenol resin, polyimide resin and polycarbonate resin are used. Among them, an epoxy resin and phenol resin are preferred from the viewpoint of coating characteristics. The contents of the thermosetting resin relative to the total weight of the functional paste are, preferably 0.1-30 wt. %, and more preferably 1-10 wt. %.

In the binder, a hardener such as dicyandiamide and fatty polyamine is added; among them, dicyandiamide is preferred. The contents of the hardener relative to the total weight of the functional paste are, preferably 0.1-30 wt. %, and more preferably 1-20 wt. %.

In the binder, a hardening accelerator such as 3-(3,4-dichlorophenyl)-1,1-dimethylurea and tertiary amine is further added; among them, 3-(3,4-dichlorophenyl)-1,1-dimethylurea is preferred. The contents of the hardening accelerator relative to the total weight of the functional paste are, preferably 0.01-10 wt. %, and more preferably 0.1-7.0 wt. %.

As an organic solvent of the functional paste of the invention, any organic solvent which can homogeneously disperse the bifluoride, i.e., an inorganic salt, in the functional paste, can be used, for example, polyhydric alcohol such as glycerin, ethylene glycol, glucitol and mannitol, or their mixture. Among them, glycerin and ethylene glycol are preferred from the viewpoint of reactivity. The contents of the organic solvent relative to the total weight of the functional paste are, preferably 0.1-30 wt. %, and more preferably 1-20 wt. %.

Furthermore, in the functional paste of the invention, a diluent such as butyl carbitol, methyl carbitol, solubesso(?) 150 may be added to adjust the viscosity to be applicable to screen printing (approximately 200-500 poise). Among these diluents, butyl carbitol is preferred. The contents of the diluent relative to the total weight of the functional paste are, preferably 0.1-10 wt. %, and more preferably 0.5-7 wt. %.

In order to improve the electrical contact between metal powders, a colloidal solution such as a silver colloidal solution AgE-102 (Nippon Paint Co., Ltd.) and DCG (Sumitomo Metal Mining Co., Ltd.) may be added to the functional paste of the invention. The contents of the colloidal solution in terms of Ag-converted amount relative to the total weight of the functional paste are, preferably 1.0-20 wt. %, and more preferably 1.5-15 wt. %.

Furthermore, in order to promote the breakage of an oxidation layer on the surface of the metal powder, unsaturated fatty acid such as oleic acid and linoleic acid may be diluted in the functional paste of the invention. The contents of the unsaturated fatty acid relative to the total weight of the functional paste are, preferably 0.1-5.0 wt. %, and more preferably 0.5-3.0 wt. %.

The functional paste of the invention with the above composition can be, after thorough mixture of the paste using, e.g., a hybrid mixer until homogeneous dispersion is achieved, painted in a desired shape using various methods including printing, spraying and brush painting. Subsequently, after drying at a temperature of 30-80° C., an electric circuit can be easily formed by baking at a temperature of 150-250° C. for 5-20 min.

An example of the fabrication method of electrodes of solar cells using the functional paste of the invention is explained (FIG. 1). First, n-type impurities are dispersed on a p-type silicon substrate to form an n-type region (n+ layer). Next, an antireflection layer ($SiO_2$, $SiN_x$) is formed on the n-type region, which becomes an acceptance surface, using, e.g., a CVD device; then a p+ layer, which is a region for the dispersion of high-concentration p-type impurities, is formed on the opposite surface of the acceptance surface.

Then, after attachment and drying of the functional paste of the invention in a desired electrode shape using, e.g., a screen printing method, the paste is baked on the antireflection layer, so that a surface electrode which achieves good electric conduction with the n-layer silicon can be fabricated while etching the antireflection layer. The functional paste of the invention has both functions of the etching reaction for antireflection layers and the electric conduction; therefore, surface electrodes can be easily fabricated by a single step. Finally, by the formation of a back-surface electrode underneath the p+ layer, a solar cell with superior electrical properties can be obtained.

The following examples are provided for detailed illustrative purposes and are not intended to restrict the invention.

EXAMPLE 1

A mixture of
Ag-coated Ni powder: 93 parts by weight (75.0 wt. %),
oleic acid: 1 part by weight (0.8 wt. %),
epoxy resin: 6 parts by weight (4.8 wt. %),
ammonium hydrogen fluoride: 3 parts by weight (2.4 wt. %), and
butyl carbitol: 6 parts by weight (4.8 wt. %),
prepared using a hybrid mixer was added with a mixture of glycerin/ethylene glycol=3/1 weight ratio in an amount of 15 parts by weight (12.1 wt. %), well mixed, and the resultant was applied on a Si wafer with a width approximately 1 mm, length approximately 1 cm, and thickness approximately 400 μm, then baked on a hot plate in air at 70-75° C. for 5 min and subsequently at 220° C. for 15 min, so that an electrode was formed. The resistance between the two electrodes was 90 Ω.

The preparation of the above composition excluding the ammonium hydrogen fluoride was used to form an electrode using the same process. The resistance between the two electrodes was 210 kΩ.

EXAMPLE 2

A mixture of

Ag-coated Ni powder: 93 parts by weight (75.0 wt. %), oleic acid: 1 part by weight (0.8 wt. %), epoxy resin: 6 parts by weight (4.8 wt. %), ammonium hydrogen fluoride: 3 parts by weight (2.4 wt. %), and butyl carbitol: 6 parts by weight (4.8 wt. %), prepared using a hybrid mixer was added with a mixture of glycerin/ethylene glycol=3/1 weight ratio in an amount of 15 parts by weight (12.1 wt. %), well mixed, and the resultant was applied on a Si wafer having a $SiO_2$ layer of approximately 80 nm thickness, with a width approximately 1 mm, length approximately 1 cm, and thickness approximately 400 μm, then baked on a hot plate in air at 70-75° C. for 5 min and subsequently at 220° C. for 15 min, so that an electrode was formed. The resistance between the two electrodes was 900 Ω.

The preparation of the above composition excluding the ammonium hydrogen fluoride was used to form an electrode using the same process. The resistance between the two electrodes was 100 MΩ or greater.

EXAMPLE 3

A mixture of

Ag-coated Ni powder: 93 parts by weight (66.9 wt. %), oleic acid: 1 part by weight (0.7 wt. %), epoxy resin: 6 parts by weight (4.3 wt. %), ammonium hydrogen fluoride: 3 parts by weight (2.2 wt. %), and butyl carbitol: 6 parts by weight (4.3 wt. %), prepared using a hybrid mixer was added with a mixture of glycerin/ethylene glycol=3/1 weight ratio in an amount of 15 parts by weight (10.8 wt. %) and a silver colloidal solution AgE-102 (Nippon Paint Co., Ltd.) in an amount of 15 parts by weight (10.8 wt. %), well mixed, and the resultant was applied on a Si wafer having a $SiO_2$ layer, with a width approximately 1 mm, length approximately 1 cm, and thickness approximately 400 μm, then baked on a hot plate in air at 70-75° C. for 5 min and subsequently at 220° C. for 15 min, so that an electrode was formed. The resistance between the two electrodes was 160 Ω.

The preparation of the above composition excluding the silver colloidal solution AgE-102 was used to form an electrode using the same process. The resistance between the two electrodes was 550 Ω.

EXAMPLE 4

A mixture of

Ag-coated Ni powder: 93 parts by weight (66.9 wt. %), oleic acid: 1 part by weight (0.7 wt. %), epoxy resin: 6 parts by weight (4.3 wt. %), ammonium hydrogen fluoride: 3 parts by weight (2.2 wt. %), and butyl carbitol: 6 parts by weight (4.3 wt. %), prepared using a hybrid mixer was added with a mixture of glycerin/ethylene glycol=3/1 weight ratio in an amount of 15 parts by weight (10.8 wt. %) and a silver colloidal solution AgE-102 (Nippon Paint Co., Ltd.) in an amount of 15 parts by weight (10.8 wt. %), well mixed, and the resultant was applied on a Si wafer having a $SiN_x$ layer of approximately 90 nm thickness, with a width approximately 1 mm, length approximately 1 cm, and thickness approximately 400 μm, then baked on a hot plate in air at 70-75° C. for 5 min and subsequently at 220° C. for 15 min, so that an electrode was formed. The resistance between the two electrodes was 1.9 kΩ.

The preparation of the above composition excluding the mixture of glycerin/ethylene glycol=3/1 weight ratio was used to form an electrode using the same process. The resistance between the two electrodes was 29 kΩ.

EXAMPLE 5

A mixture of

Ag-coated Ni powder: 93 parts by weight (66.9 wt. %), oleic acid: 1 part by weight (0.7 wt. %), epoxy resin: 6 parts by weight (4.3 wt. %), ammonium hydrogen fluoride: 3 parts by weight (2.2 wt. %), and butyl carbitol: 6 parts by weight (4.3 wt. %), prepared using a hybrid mixer was added with a mixture of glycerin/ethylene glycol=3/1 weight ratio in an amount of 15 parts by weight (10.8 wt. %) and a silver colloidal solution AgE-102 (Nippon Paint Co., Ltd.) in an amount of 15 parts by weight (10.8 wt. %), well mixed, and the resultant was applied on a Si wafer with a width approximately 1 mm, length approximately 1 cm, and thickness approximately 400 μm, then baked on a hot plate in air at 70-75° C. for 5 min and subsequently at 220° C. for 15 min, so that an electrode was formed. The resistance between the two electrodes was 0 Ω.

The preparation of the above composition excluding the mixture of glycerin/ethylene glycol=3/1 weight ratio was used to form an electrode using the same process. The resistance between the two electrodes was 9.3 Ω.

EXAMPLE 6

A mixture of

Cu powder: 93 parts by weight (66.9 wt. %), oleic acid: 1 part by weight (0.7 wt. %), epoxy resin: 6 parts by weight (4.3 wt. %), ammonium hydrogen fluoride: 3 parts by weight (2.2 wt. %), and butyl carbitol: 6 parts by weight (4.3 wt. %), prepared using a hybrid mixer was added with a mixture of glycerin/ethylene glycol=3/1 weight ratio in an amount of 15 parts by weight (10.8 wt. %) and a silver colloidal solution AgE-102 (Nippon Paint Co. Ltd.) in an amount of 15 parts by weight (10.8 wt. %), well mixed, and the resultant was applied on a Si wafer of approximately 80 nm thickness, with a width approximately 1 mm, length approximately 1 cm, and thickness approximately 400 μm, then baked on a hot plate in air at 70-75° C. for 5 min and subsequently at 220° C. for 15 min, so that an electrode was formed. The resistance between the two electrodes was 10 kΩ.

The preparation of the above composition excluding the ammonium hydrogen fluoride was used to form an electrode using the same process. The resistance between the two electrodes was 2 MΩ.

EXAMPLE 7

A mixture of
Ag-coated Ni powder: 90 parts by weight (66.7 wt. %),
oleic acid: 1 part by weight (0.7 wt. %),
phenol resin: 9 parts by weight (6.7 wt. %),
ammonium hydrogen fluoride: 3 parts by weight (2.2 wt. %), and
butyl carbitol: 2 parts by weight (1.5 wt. %),
prepared using a hybrid mixer was added with a mixture of glycerin/ethylene glycol=3/1 weight ratio in an amount of 15 parts by weight (11.1 wt. %) and a silver colloidal solution AgE-102 (Nippon Paint Co. Ltd.) in an amount of 15 parts by weight (11.1 wt. %), well mixed, and the resultant was applied on a Si wafer, with a width approximately 5 mm, length approximately 5 mm, and thickness approximately 200 μm, then baked on a hot plate in air at 70-75° C. for 5 min and subsequently at 220° C. for 15 min, so that an electrode was formed. The resistance between the two electrodes was 34 kΩ.

The preparation of the above composition excluding the ammonium hydrogen fluoride and Ag-coated Ni powder-102 was used to form an electrode using the same process. The resistance between the two electrodes was 730 kΩ.

EXAMPLE 8

A mixture of
Ag-coated Ni powder: 90 parts by weight (66.7 wt. %),
oleic acid: 1 part by weight (0.7 wt. %),
phenol resin: 9 parts by weight (6.7 wt. %),
ammonium hydrogen fluoride: 3 parts by weight (2.2 wt. %), and
butyl carbitol: 2 parts by weight (1.5 wt. %),
prepared using a hybrid mixer was added with a mixture of glycerin/ethylene glycol=3/1 weight ratio in an amount of 15 parts by weight (11.1 wt. %) and a silver colloidal solution AgE-102 (Nippon Paint Co. Ltd.) in an amount of 15 parts by weight (11.1 wt. %), well mixed, and the resultant was applied on a Si wafer having a SiO$_2$ layer of approximately 80 μm thickness, with a width approximately 5 mm, length approximately 5 mm, and thickness approximately 200 μm, then baked on a hot plate in air at 70-75° C. for 5 min and subsequently at 220° C. for 15 min, so that an electrode was formed. The resistance between the two electrodes was 12 kΩ.

The preparation of the above composition excluding the ammonium hydrogen fluoride and Ag-coated Ni powder-102 was used to form an electrode using the same process. The resistance between the two electrodes was 10 MΩ or more than.

The functional paste of the invention can be used for the fabrication of surface electrodes of solar cells and for the formation of electric circuits.

BRIEF DESCRIPTION OF THE DRAWINGS

FIG. 1 shows a method for the fabrication of electrodes of solar cells.

DESCRIPTION OF SYMBOLS

1: p-type silicon substrate
2: n+ layer
3: antireflection layer (SiO$_2$, SiN$_x$)
4: p+ layer
5: surface electrode
6: back-surface electrode

The invention claimed is:

1. A functional paste comprising 60-99 wt % of a metal powder, 0.1-20 wt. % of an etching agent, 0.1-30 wt. % of a binder and 0.1-30 wt. % of an organic solvent, and 0.1-5.0 wt. % unsaturated fatty acid,
wherein the metal powder is one or more of Ag-coated Ni powder, Cu powder, Ag powder, Au powder, or Pd powder, and
wherein the etching agent has removal activity of oxidation layers on the surfaces of metal powders, or has etching activity for antireflection layers of solar cells, or has removal activity of oxidation layers and/or silicon nitride layers.

2. A functional paste according to claim 1, wherein the unsaturated fatty acid is oleic acid or linoleic acid.

3. The paste according to claim 1, further comprising a diluent.

4. The paste according to claim 3 wherein the diluent is butylcarbitol.

5. The paste according to claim 1, wherein the etching agent has etching activity for antireflection layers of solar cells.

6. The paste according to claim 1, wherein the etching agent has removal activity of oxidation layers and/or nitride layers of Si.

7. The paste according to claim 1, wherein the etching agent is NH$_4$HF$_2$ or NH$_4$F.

8. The paste according to claim 1, wherein the binder contains a thermosetting resin.

9. The paste according to claim 8, wherein the thermosetting resin is an epoxy resin and/or phenol resin.

10. The paste according to claim 1, wherein the organic solvent is polyhydric alcohol or its mixture.

11. The paste according to claim 10, wherein the polyhydric alcohol is glycerin and/or ethylene glycol.

12. A solar cell comprising a semiconductor layer, an antireflection layer above the semiconductor layer, and a surface electrode which penetrates through the antireflection layer to bring the semiconductor layer into conduction, wherein the solar cell is fabricated by coating and baking the paste according to claim 1 on the antireflection layer in a desired electrode shape.

13. An electric circuit formed by coating and baking the paste according to claim 1, on a substrate in a desired pattern.

14. A method of fabricating a solar cell comprising a semiconductor layer, an antireflection layer above the semiconductor layer, and a surface electrode which penetrates through the antireflection layer to bring the semiconductor layer into conduction, wherein the method comprises coating and baking the paste according to claim 1, on the antireflection layer in a desired electrode shape.

15. A method of forming electric circuits, which comprises coating and baking the paste according to claim 1, on a substrate in a desired pattern.

* * * * *